United States Patent
Tsuchida et al.

(12)

(10) Patent No.: US 6,442,088 B1
(45) Date of Patent: Aug. 27, 2002

(54) SEMICONDUCTOR MEMORY SYSTEM, AND ACCESS CONTROL METHOD FOR SEMICONDUCTOR MEMORY AND SEMICONDUCTOR MEMORY

(75) Inventors: Kenji Tsuchida, Kawasaki; Haruki Toda, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/986,658

(22) Filed: Nov. 9, 2001

Related U.S. Application Data

(63) Continuation of application No. 09/852,037, filed on May 10, 2001, now Pat. No. 6,335,904, which is a continuation of application No. 09/411,373, filed on Oct. 4, 1999, now Pat. No. 6,256,258, which is a continuation of application No. 09/305,752, filed on May 6, 1999, now Pat. No. 5,973,991.

(30) Foreign Application Priority Data

May 7, 1998 (JP) .......................................... 10-124367

(51) Int. Cl.[7] .................................................. G11C 7/00
(52) U.S. Cl. ........................ 365/203; 365/190; 365/202
(58) Field of Search ................................ 365/205, 203, 365/190, 202

(56) References Cited

U.S. PATENT DOCUMENTS

| | | | |
|---|---|---|---|
| 4,924,375 A | | 5/1990 | Fung et al. |
| 5,438,548 A | | 8/1995 | Houston |
| 5,594,704 A | | 1/1997 | Konishi et al. |
| 5,689,461 A | * | 11/1997 | Kaneko et al. ............. 365/203 |
| 5,757,707 A | * | 5/1998 | Abe ........................... 365/203 |
| 5,815,463 A | | 9/1998 | Shih et al. |
| 5,835,443 A | | 11/1998 | Fujita |
| 5,875,141 A | * | 2/1999 | Shirley et al. ............. 365/207 |
| 5,883,855 A | | 3/1999 | Fujita |
| 5,986,918 A | | 11/1999 | Lee |
| 5,991,223 A | | 11/1999 | Kozaru et al. |
| 6,101,152 A | | 8/2000 | Farmwald et al. |
| 6,275,435 B1 | * | 8/2001 | Su et al. ..................... 365/207 |

FOREIGN PATENT DOCUMENTS

| | | |
|---|---|---|
| EP | 0339224 A2 | 3/1989 |
| EP | 0771007 A2 | 10/1996 |
| EP | 0788110 A2 | 1/1997 |

OTHER PUBLICATIONS

Yasuhara Sato et al., Symposium on VLSI Circuits Digest of Technical Papers: "Fast Cycle RAM (FCRAM); a 20-ns Random Row Access, Pipe-Lined Operating DRAM," Jun. 1998.

* cited by examiner

*Primary Examiner*—Son Mai
(74) *Attorney, Agent, or Firm*—Banner & Witcoff, Ltd.

(57) ABSTRACT

In a semiconductor memory system, an SDRAM comprises a memory cell array 101 which is divided into a plurality of cell array blocks, a column decoder, a row decoder, and a sense amplifier circuit. In the SDRAM, a first operation mode with a first cycle time is set when successive access within a cell array block is conducted, a second operation mode with a second cycle time shorter than the first cycle time is set when successive access covering the cell array blocks being apart from each other is conducted, and a third operation mode with a medium cycle time is set when successive access covering the cell array blocks adjacent to each other is conducted. With the above constitution, high speed access can be realized without provision of a specific accessory circuit while suppressing overhead for the semiconductor chip size.

19 Claims, 10 Drawing Sheets

SEMICONDUCTOR MEMORY SYSTEM, AND ACCESS CONTROL METHOD FOR SEMICONDUCTOR MEMORY AND SEMICONDUCTOR MEMORY

This application is a continuation of U.S. patent application Ser. No. 09/852,037, filed May 10, 2001 now U.S. Pat. No. 6,335,904, which is a continuation of U.S. patent application Ser. No. 09/411,373, filed Oct. 4, 1999, now U.S. Pat. No. 6,256,258, which is a continuation of U.S. patent application Ser. No. 09/305,752, filed May 6, 1999, now U.S. Pat. No. 5,973,991, which claims priority under 35 U.S.C. §119 to Japanese Patent Application No. 10-124367, filed May 7, 1998, the entire contents of which are incorporated herein by reference.

BACKGROUND OF THE INVENTION

The present invention relates to a semiconductor memory system using a DRAM or the like which can realize a high speed access.

A DRAM has been developed in integration to the highest level among MOS semiconductor memories because of the simplicity of a memory cell in a comparative sense and is now used as a main memory of all kinds of computer based apparatuses. On the other hand, there has been progress in improving memory performance being driven by the rapid increase in capabilities of a microprocessor (MPU) in recent years: various kinds of DRAMs each provided with a high speed data cycle function have been proposed and some are already in early stages of mass production. Typical examples are the so-called synchronous DRAM (SDRAM) in which all I/O data are stored or retrieved in synchronism with a system clock and a double-data-rate SDRAM (DDR-SDRAM) which makes it possible to use both edges of a clock pulse as triggers for access though similar to the former in terms of operation, and the like. In addition to the above described DRAMs, a RAMBUS DRAM (RDRAM) (under specifications of Rambus Inc.) in which data transfer is enabled at a high speed with a protocol-based command, and the like have also been developed and a trend in which a conventional asynchronous DRAM is replaced with a synchronous DRAM can be assured to be a necessity in the future.

A characteristic of such a synchronous DRAM is that the maximal bandwidth is operated at a very high speed. As the maximal bandwidth of the latest SDRAM versions, for example, 100 Mbps has been achieved. A DDR-SDRAM and a R-DRAM are estimated to reach 200 Mbps and 800 Mbps respectively in the future, Such a high bandwidth, however, is realized only in burst access along a limited, specific row direction in a memory space. That is, a speed in a so-called random access operation in which a row address is changed can be attained only on almost the same order as a conventional asynchronous DRAM.

A hierarchical structure of a memory has been adopted as a general measure to cope with this situation in a computer system which adopts a DRAM as the main memory. In a concrete manner, the measure is that a cache memory which is constructed from an SDRAM which can realize a high speed access as compared with a DRAM is interposed between a MPU and the DRAM and data of part of the DRAM is cached in the SDRAM. In this case, a memory access from the MPU is performed on the high speed cache memory, and only when an access instruction enters an address space which is not cached in the cache memory, that is, when a cache miss occurs, an access is performed on the DRAM. A great improvement of a computer performance has been realized by adopting this measure even when operating speeds of the MPU and the DRAM are different from each other.

When a cache miss has occurs, however, read-out from the DRAM comes to be required and especially when a different row address in the same block in the DRAM memory space is accessed, there arises the maximal wait time for the MPU. This problem will be described with reference to FIG. 14 below.

FIG. 14 shows an example of a read operation timing for an SDRAM. When a cache miss occurs in the above described computer system which adopts a hierarchical structure of memory and a necessity of access to an SDRAM as a main memory arises, a [precharge command (Precharge)] is issued to perform precharge to an address which is now activated from the system side at time t1. Subsequently, an [activate command (Active)] is issued from the MPU after a predetermined time has elapsed and a bank corresponding to a necessary memory space is activated. A [read command (Read)] is issued after another specific time has elapsed. Data of a specific burst length is read out from the SDRAM in synchronism with a clock pulse at a time t2 when a specific time elapsed after the issuance of the read command. As shown here, the maximal bandwidth when a read operation is successively performed synchronously with a clock pulse is very high, whereas an effective bandwidth for random access in a cache miss is greatly decreased. That is, it is found that a portion of the time period between the time t1 and the t2 when no data is read out, in other words a wait time as viewed from the MPU side, is long.

In a concrete manner, in the case of the specifications of an SDRAM shown in FIG. 14, the maximal bandwidth in a random access cycle is of the order of 36% of that in a burst cycle at most. There will arise a high possibility for this to be a bottle neck in improving computer performance and therefore, the demand for a high performance DRAM has been increasing in which a high access time and a high speed cycle time are realized. Especially, in a multi-MPU system to which a current high-performance server machine is central, high importance is attached to not only high-speed burst transfer but high speed random access. Besides, in a consumer multi-media system in which real time reproduction of a dynamic image is the main object in the future, as well, a DRAM in which a high-speed random access is enabled in a similar way is considered to be a requirement.

With such demands in the backgrounds, an Enhanced SDRAM (ESDRAM) which has been announced from Enhanced Memory Systems Inc., as shown in FIG. 15, a Virtual Channel Memory (VCM) which has been announced from NEC Corp., as shown in FIG. 16, and the like have been proposed.

As described above, a DRAM, in which a high speed data cycle has been realized; represented by an SDRAM, an RDRAM and the like, suffers a long wait time when an access hit miss requires a random access to occur, which is a problem causing a bottle neck in performance improvement of a system.

In the methods of FIGS. 15 and 16 in each of which a large capacity cache memory is provided in order to realize a high speed access time and a high speed cycle time, the overhead for a chip size is high, which in turn causes a problem that realization of the low cost is harder to achieve.

BRIEF SUMMARY OF THE INVENTION

The present invention has been made in light of the above described circumstances and it is accordingly an object of the present invention to provide a semiconductor memory system and an access control method for a semiconductor memory, in which high speed access is made possible without a specific accessory circuit provided while overhead for a chip size is suppressed.

A semiconductor memory system according to the present invention comprises: a semiconductor memory including a memory cell array in which memory cells are located at intersections between a plurality of bit line pairs and a plurality of word lines, the memory cell array of the semiconductor memory being divided into a plurality of cell array blocks, a decoder circuit for selecting a memory cell of the memory cell array, and a sense amplifier circuit for reading out data on a selected memory cell of the memory cell array; an access circuit for successively conducting access on the cell array blocks of the memory cell array of the semiconductor memory; and a control circuit for performing control to change a cycle time according to an access order of the cell array blocks when successive access is conducted on the cell array blocks of the memory cell array of the semiconductor memory.

The control circuit may perform access control in a first operation mode of a first cycle time when successive access within one cell array block of the memory cell array is conducted, and the control circuit may perform access control in a second operation mode of a second cycle time shorter than the first cycle time of the first operation mode when successive access covering the cell array blocks being apart from each other of the memory cell array is conducted.

When the memory cell array of a semiconductor memory adopts a shared sense amplifier system in which cell array blocks adjacent to each other share a series of sense amplifiers, the control circuit may perform access control in a third operation mode of a third cycle time which is a cycle time between the first cycle time of the first operation mode and the second cycle time of the second operation mode when successive access covering cell array blocks adjacent to each other of the memory cell array is conducted.

Furthermore, the present invention has the characteristics listed below when the third operation mode has been set:

(a) The cell array blocks which are adjacent to each other of the memory cell array of the semiconductor memory may share the series of sense amplifiers including bit line equalizer circuits, and when the third operation mode is set, a bit line equalize operation of a cell array block which is accessed in advance and a word line activate operation of a cell array block which is subsequently accessed may be partly in parallel progressed in the semiconductor memory.

(b) The cell array blocks which are adjacent to each other of the memory cell array of the semiconductor memory may share a series of sense amplifiers which include bit line equalizer circuits, and the semiconductor memory may comprise transfer gates interposed between the series of the sense amplifiers and the cell array blocks, and selectively controlled to be conductive, and when the third operation mode is set, a bit line equalize operation of a cell array block which is accessed in advance and a word line activate operation of a cell array block which is subsequently accessed may be partly in parallel progressed by control on conduction of the transfer gates in the semiconductor memory.

(c) In the memory cell array of the semiconductor memory, the cell array blocks which are adjacent to each other of the memory cell array of the semiconductor memory may share a series of sense amplifiers, the semiconductor memory may comprise transfer gates interposed between the series of sense amplifiers and the cell array blocks and selectively controlled to be conductive, and bit line equalizer circuits which are respectively arranged in the series of sense amplifiers and the cell array blocks, and when the third operation mode is set, a bit line equalizer circuit arranged in the series of the sense amplifiers may be activated ahead of a bit line equalizer circuit arranged in each cell array block in the semiconductor memory.

(d) Furthermore, in the case of (c), the transfer gates between the cell array blocks and the series of the sense amplifiers may be controlled to be non-conductive while the bit line equalize operation in the series of the sense amplifiers or the cell array block are conducted.

According to the present invention, in access control of the semiconductor memory, since a speed control that a plurality of operation modes which are different from one another in cycle time according to the access order of the cell array blocks which are successively accessed are set is introduced, high speed access which cannot be obtained in a conventional DRAM or the like can be achieved without provision of a cache section. In a concrete manner, in a DRAM or the like, a memory cell array is divided into a plurality of cell array blocks from the view points of consumed power and a speed. When successive access is conducted within the same cell array block, since a word line activate operation and a bit line precharge operation should be conducted in a time series manner, access control is performed according to the first operation mode with a first cycle time. When successive access covering independent cell array blocks is conducted, since operations of a bit line precharge and a word line activation can independently be conducted in each cell array block, access control is performed according to the second operation mode with the second cycle time shorter than the first cycle time. When such access control is performed, a high speed operation of the whole of a memory system can be realized, since successive access within the same cell array block is low on a probability in the semiconductor memory which is divided.

Further, when a common sense amplifier circuit system is adopted, word line activation and bit line precharge in sub-cell arrays adjacent to each other can be partly overlapped with each other by control of a transfer gate. When successive access covering adjacent cell array blocks is conducted while the overlap operation is used, the access control can be performed according to the third operation mode with the third cycle time being somewhere between the first operation mode and the second operation mode.

With this method, when successive access covering adjacent sub-cell arrays is conducted, the successive access can be realized with a cycle time faster than successive access within a sub-cell array, though slower than successive access covering dispersed sub-cell arrays.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Below, fundamental constructions of the present invention will be described with reference to the accompanying drawings.

Figure 1:
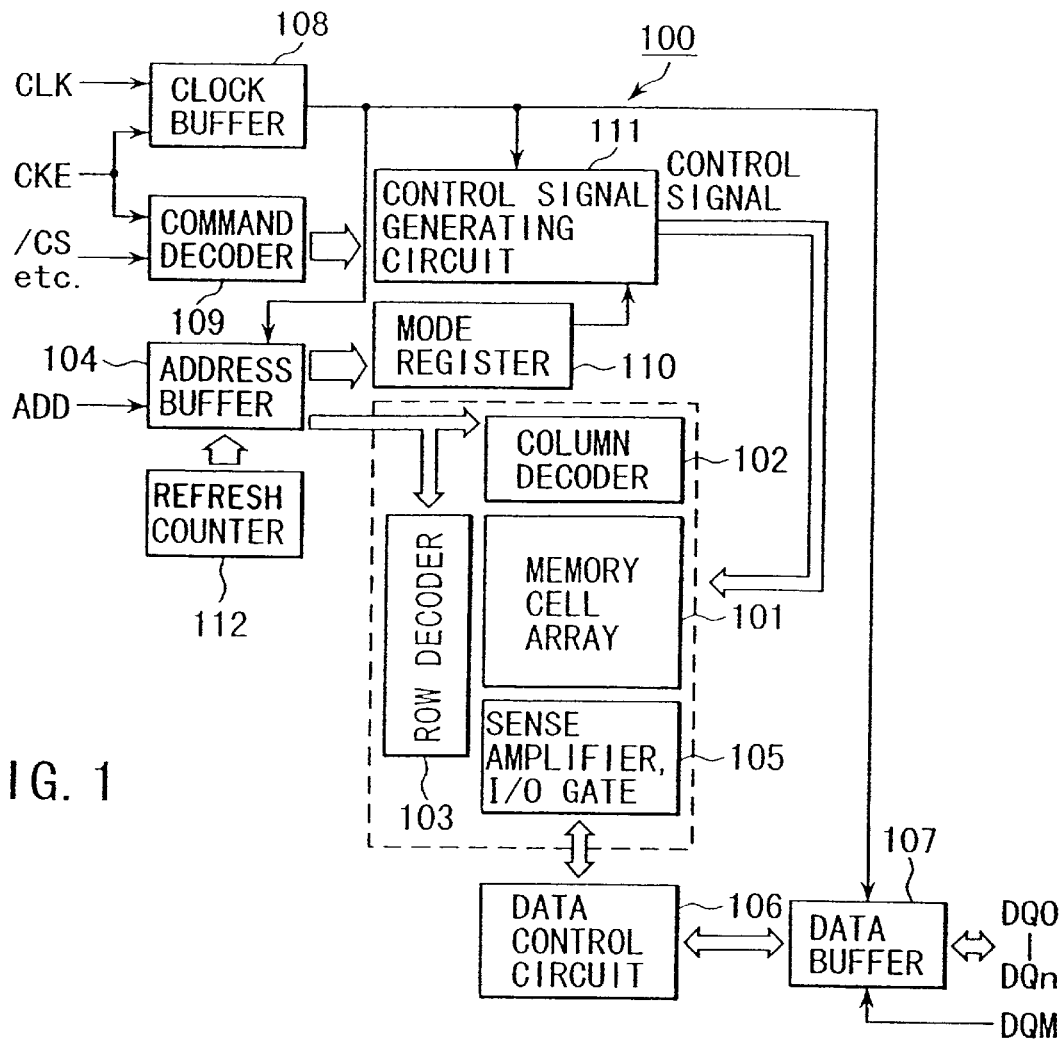
FIG. 1 shows a equivalent circuit of an SDRAM to which the present invention is applied.

FIG. 1 shows an equivalent circuit of an SDRAM 100 according to the present invention in a form of block diagram. A memory cell array 101 is constructed from dynamic memory cells located at intersections between bit lines and word lines. An address signal ADD supplied from the outside is latched in an address buffer 104 and the latched address signal ADD is decoded by a column decoder 102 and a row decoder 103 to conduct selection of a column and a row, so that a memory cell is selected. A sense amplifier circuit (including an I/O gate) 105 for performing read-out/write-in of data on a memory cell of the memory cell array 101 is connected to a data buffer 107 by way of a data control circuit 106. Data input/output between memory cell array 101 and the outside are performed by way of the data buffer 107.

A clock buffer 108 to latch an external clock CLK is provided in order to perform data read-out/write-in in clock synchronization. Besides, a command decoder 109 is provided in order to latch and decode various kinds of external commands, for example/CS. The clock buffer 108 and the command decoder 109 are activated by a clock enabling signal CKE. A control signal generating circuit 111 is provided in order to generate various kinds of control signals for data read-out/write-in by a command decoded in the command decoder 109 and a clock which is attained from the clock buffer 108. The control signal generating circuit 111 generates a various kinds of control signals such as a precharge control signal for a bit line, an activate control signal for a sense amplifier and the like for a semiconductor memory (a core circuit section) comprising the memory cell array 101, the column decoder 102, the row decoder 103, and the sense amplifier circuit (including the I/O gate) 105. A mode register 110 is used to set in advance a various kinds of operation modes such as a burst length, an access latency and the like and the control signal generating circuit 111 is controlled by an output of the mode setting register 110.

Figure 2A:
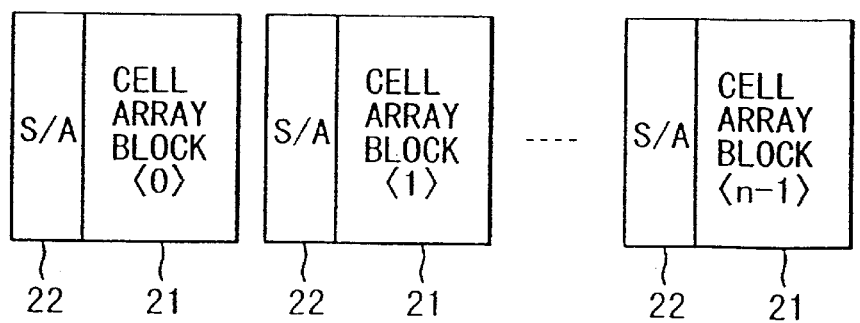
FIGS. 2A and 2B shows respectively divided structures of a memory cell array of the SDRAM.
Figure 2B:
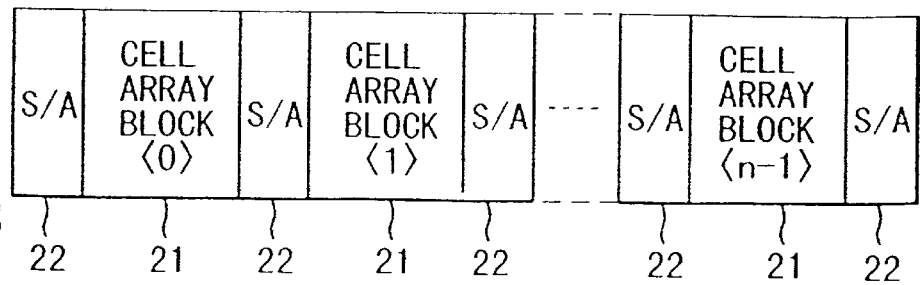

FIGS. 2A, 2B shows structure examples of a memory cell array and a sense amplifier circuit. As illustrated, the memory cell array is divided into a plural number (n in the cases of FIGS. 2A, 2B) of cell array blocks 21 and a series of sense amplifiers 22 constituting the sense amplifier circuits 105 of FIG. 1 are respectively provided for each cell array block 21 while being attached. Especially, FIG. 2B shows the case where a common amplifier system in which two adjacent cell array blocks 21 share one sense amplifier 22 is employed. Though not shown in each cell array block 21, a plurality of word lines and a plurality of bit line pairs which intersect with the word lines are provided and memory cells are located at the intersections.

Figure 3:
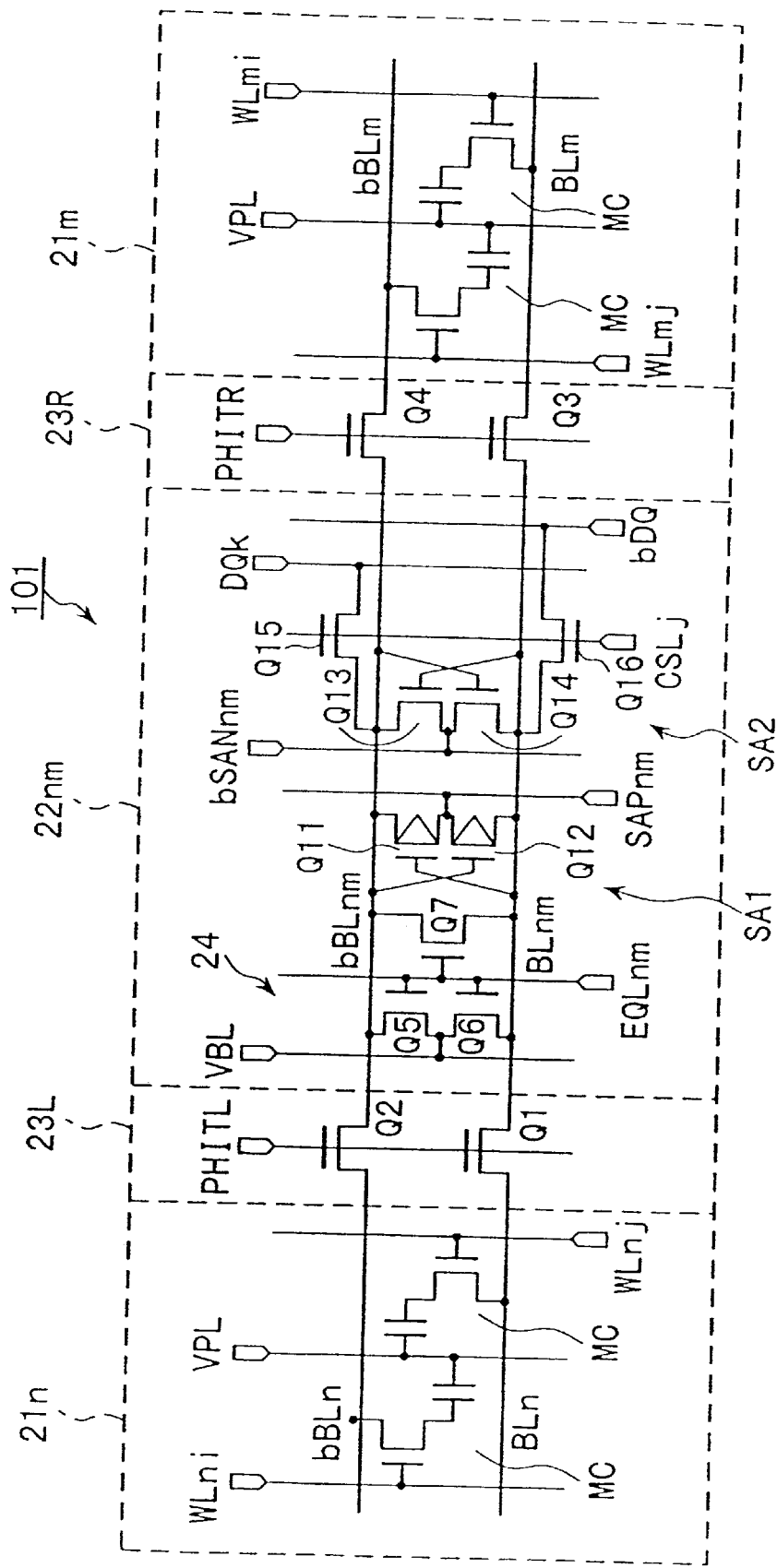
FIG. 3 shows a more concrete construction of memory cell array in the case of a common sense amplifier system.

FIG. 3 shows a construction of two adjacent cell array blocks 21n, 21m and a sense amplifier 22nm which is shared by the two adjacent cell array block 21n, 21m in connection with a pair of bit lines in the case of a semiconductor memory system where the common sense amplifier system of FIG. 2B is adopted. Memory cells MC with a construction of one transistor/one capacitor, on which data read-out/write-in are effected between bit lines BL, bBL while being driven by word lines WL (WLni, WLnj; WLmi, WLmj), are arranged in the cell array blocks 21n, 21m as shown in the figure. In FIG. 3, a transfer gate 23L constructed from NMOS transistors Q1, Q2 which are respectively interposed between the bit lines BLn, bBLn in the cell array block 21n in the left side and the bit lines BLnm, bBLnm in the sense amplifier 22nm is provided in order to selectively connect them each another. In a similar way, a transfer gate 23R constructed from NMOS transistors Q3, Q4 which are respectively interposed between the bit lines BLm, bBLm in the cell array block 21m in the right side and the bit lines BLnm, bBLnm in the sense amplifier 22nm is provided in order to selectively connect them each another. The transfer gates 23L, 23R are controlled and thereby the sense amplifier 22nm are selectively connected to one of the cell array blocks 21n, 21m.

The sense amplifier 22nm comprises: a PMOS sense amplifier SA1 for amplification on the H level (high level) side of a flip-flop constructed from PMOS transistors Q11, Q12; and a NMOS sense amplifier SA2 for amplification on the L level (low level) side of a flip-flop constructed from NMOS transistors Q13, Q14. In a concrete manner, the sources of the PMOS transistors Q11, Q12 constituting the PMOS sense amplifier SA1 are connected to a signal line onto which an activate signal SAPnm is commonly applied and the drains thereof are respectively connected to the bit lines bBLnm, BLnm and the gates thereof are respectively connected to the bit lines BLnm, bBLnm. In a similar way, in a concrete manner, the sources of the NMOS transistors Q13, Q14 constituting the NMOS sense amplifier SA2 are connected to a signal line onto which an activate signal bSANnm is commonly applied, the drains thereof are respectively connected to the bit lines bBLnm, BLnm and the gates thereof are respectively connected to the bit lines BLnm, bBLnm.

The sense amplifier 22nm has a bit line equalizer circuit 24 constructed from a precharge NMOS transistors Q5, Q6 for precharging the bit lines BLnm, bBLnm to a precharge potential VBL and an equalize NMOS transistor Q7. The drains of the precharge NMOS transistors Q5, Q6 are commonly connected to a signal line onto which a precharge potential VBL is applied, the sources thereof are respectively connected to the bit lines bBLnm, BLnm and the gates thereof are connected to a signal line onto which an equalize control signal EQLnm is applied. The gate of the equalize NMOS transistor Q7 is connected to the gates of the precharge NMOS transistors Q5, Q6 and the source/drain thereof are respectively connected to the bit lines bBLnm, BLnm in an interposed manner therebetween.

The core circuit section of the SDRAM shown in FIG. 3 has a construction which has no specific modification compared with a conventional general use DRAM, but the transfer gates 23L, 23R are respectively provided thereto in order to apply a common amplifier system. When the cell array block 21n is selectively activated by an external address input, the transfer gates 23L, 23R are respectively controlled to be in the conductive state and the non-conductive state and a memory cell arranged in the cell array block 21n and the sense amplifier 22nm are connected. At this point, the cell array block 21m in the non-select state is in the precharge state being separated from the sense amplifier 22nm by the transfer gate 23R. On the other hand, when the cell array block 21m is selectively activated by an external address input, the transfer gates 23R, 23L are respectively controlled to be in the conductive state and the non-conductive state and a memory cell arranged in the cell array block 21m and the sense amplifier 22nm are connected. At this point, the cell array block 21n in the non-select state is in the precharge state being separated from the sense amplifier 22nm by the transfer gate 23L.

An embodiment of access operation in an SDRAM constructed in such a manner will in a concrete manner be described below:

Embodiment 1

Figure 4:
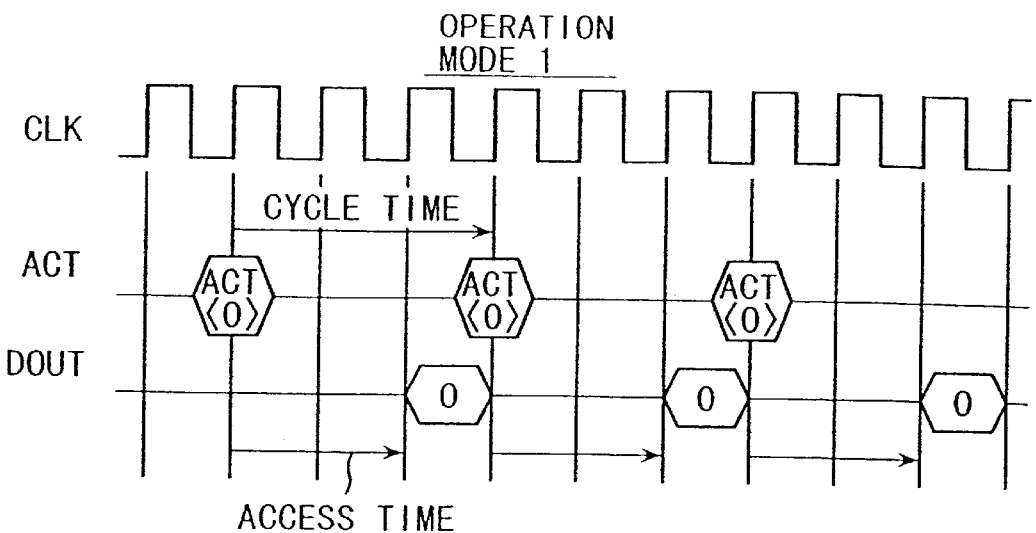
FIG. 4 is a timing diagram in an operation mode 1 when successive access is performed within a cell array block according to a first embodiment of the present invention.
Figure 5:
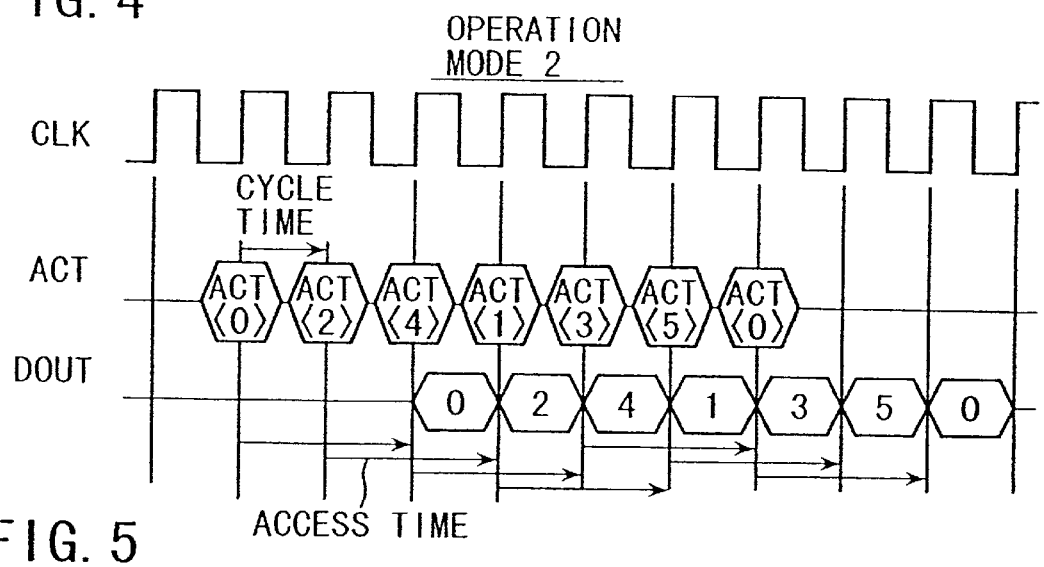
FIG. 5 is a timing diagram in an operation mode 2 when successive access is performed across dispersed cell array blocks according to the first embodiment of the present invention.

FIGS. 4 and 5 schematically show access timings in two operation modes 1 and 2 according to the first embodiment. In the two operation modes 1 and 2, cycle times are different from each other depending on the access order for cell array blocks 21 (FIG. 2A) as segments in plural number. A cycle time is defined as a period for activation when the SDRAM 100 is successively activated. The mode 1 of FIG. 4 is of the case where successive access is performed on memory cells which are connected to different word lines within the same, that is, one cell array block 21 (for example, a cell block <0> in each of FIGS. 2A, 2B). In this case, since word line activation and bit line precharge are required to be conducted in a time series manner, the speed is of almost the same order as that of a conventional SDRAM. In FIG. 4, an example is shown in which a period, that is a cycle time, of an activate command ACT which is issued in synchronism with a clock CLK is set to 3 clock cycles, a time which is required until a memory cell data is read out from an activate command ACT, that is an access time is set to 2 clock cycles, wherein data is read out in a burst length 1.

The activate command ACT actually is not inputted to the DRAM 100 from the outside, but is a command which is defined by a predetermined combination of a chip select signal/CS and other control signals. The activate command ACT is decoded by the command decoder 109 (FIG. 1) and outputted to the control signal generating circuit 111 (FIG. 1). The control signal generating circuit 111 generates a series of control signals such as of bit line precharge, word line activation, sense amplifier activation and the like.

On the other hand, the operation mode 2 of FIG. 5 shows the case where successive access is conducted on memory cells while covering cell array blocks which are arranged in a independent manner, that is, in a dispersed or non-adjacent manner, or in a non-successive manner, or in an being apart manner, from one another, for example the case where successive access is conducted on memory cells while covering the cell array block <0> and the cell array block <2> in FIG. 2A or 2B. In this case, since a bit line and a sense amplifier which are connected to a memory cell are independent in each access, a cycle time faster than access in the operation mode 1 shown in FIG. 4 can be realized. In other words, in FIG. 5, there is shown the example in which the same access time as in the case of FIG. 4 is employed and a cycle time is set to 1 clock cycle.

In the first embodiment, in such a way, a cycle time is changed according to whether successive access is performed within the same cell array block or in dispersed cell array blocks. In a more detailed manner, a cycle time is changed according to whether memory cells which are successively accessed are present within the same cell array block or in dispersed cell blocks. A cycle time is shorter in successive access on memory cells in dispersed cell array blocks and thereby a higher speed operation than a conventional SDRAM can be realized without providing a specific cache section as in the case of the conventional SDRAM.

It is a common practice that, in an SDRAM, a memory cell array is divided into tens to hundreds of cell array blocks taking both aspects of consumed power and a speed into consideration. For example, in the 64 Mbit DRAMs which are currently mass-produced, the total number of array segmentation is on the order of 64 since a capacity of the minimal cell array block is about 1 Mbit. When the segmentation number is very large like this, the probability that successive access is conducted within the same cell block is low. Accordingly, the case of the embodiment where a cycle time is changed according to whether successive access is performed within the same cell array block or in dispersed cell array blocks is improved in overall performance of the system as compared with a conventional case. Besides, as a degree of segmentation of a memory cell array progresses due to increase in integration in the future, the degree of performance improvement will increasingly be higher.

Embodiment 2

The second embodiment is the case where, especially, high speed successive access covering adjacent cell array blocks is realized in an SDRAM in which a cycle time is changed according to a way of successive access as described in the first embodiment. In the second embodiment, the case where the common sense amplifier system in which adjacent cell array blocks 21 share the series of sense amplifiers 22 is adopted as shown in FIG. 2B is considered as a precondition.

The limit on an access speed in the case of adopting the control method of first embodiment will be described prior to entering the description of operation of the second embodiment.

Figure 7:
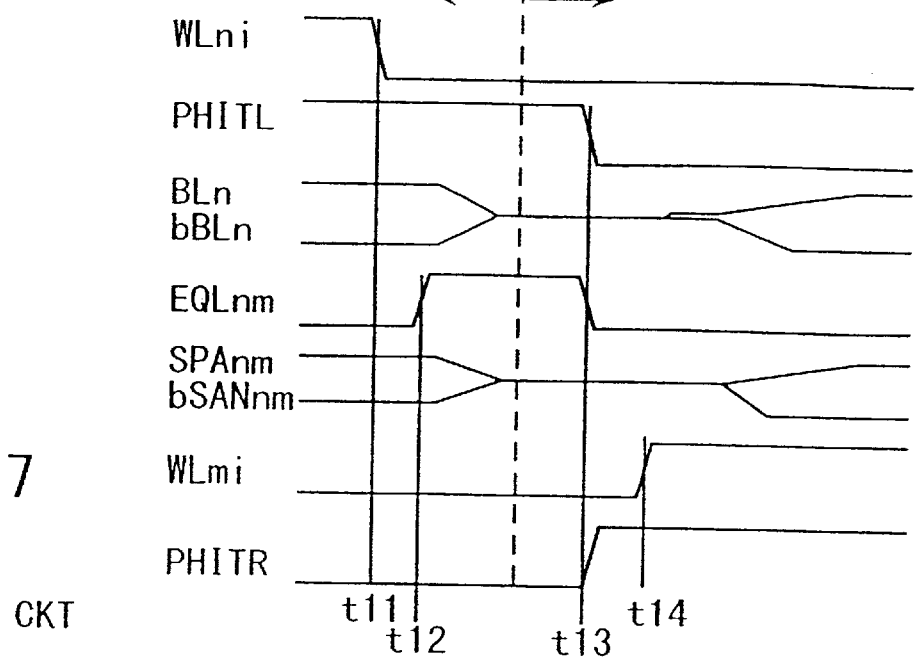
FIG. 7 is a normal operation timing diagram when successive access is performed across adjacent cell array blocks.

The case will be considered in which any one of memory cells arranged in the cell array block 21m adjacent to the cell array block 21n is accessed in succession to access which has been effected to any one of memory cells arranged in the cell array blocks 21n. At this point, the cell array block 21n which has been accessed already is made to be in the precharge state as shown in FIG. 7. In a concrete manner, a word line WLni arranged in the cell array block 21n which is already in the select state is made to assume a non-active state (a potential of a word line is decreased in the case of an NMOS memory cell) (t11) and after completion of the non-activation, the control signal EQLnm of the bit line equalizer circuit EQL is activated (t12). With this activation, the bit line pair BLn, bBLn are electrically short-circuited to each other and a potential of the bit line pair BLn, bBLn is reset to the precharge potential VBL.

After a series of precharge operations are completed, activation of the cell array block 21m which is to be accessed in succession gets started. In a concrete manner, a potential of the control signal PHITL to control the transfer gate 23L so as to be non-conductive is shifted to an L level and at the same time, a potential of the control signal EQLnm of the bit line equalizer circuit 24 is also shifted to the L level, so that the bit lines BLn, bBLn are disconnected from the precharge potential VBL (t13). At the same time, a potential of the signal PHITR to set the transfer gate 23R to the conductive state is shifted to an H level and thereafter, a word line WLmi connected to any one of the memory cells in the cell array block 21m is activated (t14).

When the control method of the first embodiment is employed as described above and successive access is performed in adjacent cell array blocks, activation of the next cell array block is performed in a time series manner while waiting for completion of a precharge operation of a cell array block which is to be accessed in advance. Therefore, since an access time and a cycle time are same as in the case of successive access within the same cell array block as shown in FIG. 4, only low speed access can be realized.

Figure 6:
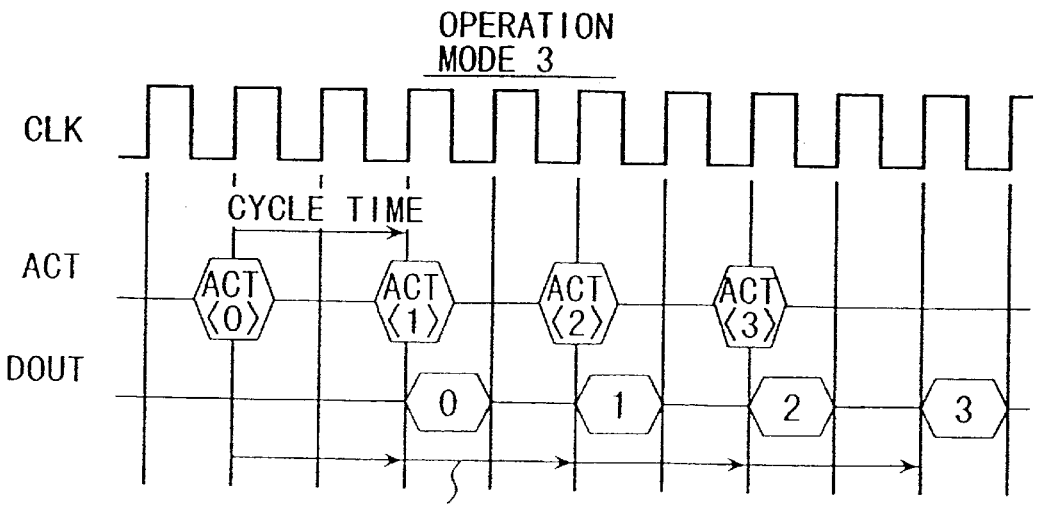
FIG. 6 is a timing diagram of an operation mode 3 when successive access is performed across adjacent cell array blocks according to a second embodiment of the present invention.

The second embodiment is directed to realization of a high speed in successive access covering such adjacent cell array blocks. FIG. 6 shows a timing diagram in the operation mode 3 in the second embodiment. Here, while an access time is same as in the operation modes 1 and 2 shown in FIGS. 4 and 5, a cycle time is set as a 2 clock cycle operation. That is, the second embodiment shows an example in which a shorter cycle time than the 3 clock cycles in the successive access within the cell array block shown in FIG. 4 is realized.

Figure 8:
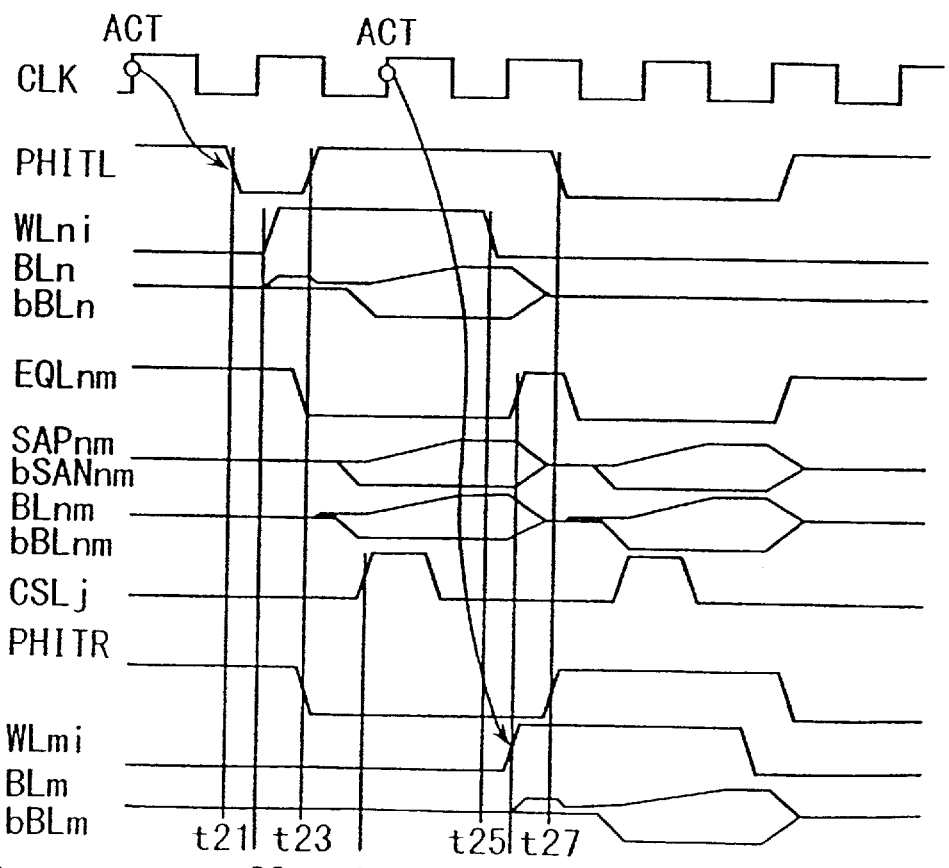
FIG. 8 is a concrete operation timing diagram in the operation mode 3 according to the second embodiment of the present invention.

A concrete operation timing in the case where such an access operation is conducted is shown in FIG. 8. In the operation timing of FIG. 8, since successive access covering adjacent cell array blocks adopts a faster cycle time than the case of successive access within the same cell array block with the common sense amplifier system in use, a precharge operation of a cell array block which is accessed in advance and a word line activate operation of a cell array block which is subsequently accessed are overlapped with each other (interleaved) in the operation timing of FIG. 8.

In FIG. 8, the case is considered where the two adjacent cell array blocks 21n, 21m shown in FIG. 3 are successively accessed. When an access command ACT for the cell array block 21n is issued, the transfer gate 23L interposed between the cell array block 22n and the sense amplifier 22nm is controlled to be non-conductive by the control signal PHITL (t21). Subsequently, any one of word lines WLni of the cell array block 21m is selected to be activated (t22). When activation of the word line is completed and cell data is read out onto the bit lines BLn, bBLn, the transfer gates 23L, 23R are respectively controlled to be conductive and non-conductive by the control signals PHITL, PHITR (t23). In this situation, a very small potential data from a memory cell of cell array block 21n is transferred to the sense amplifier 22nm to be amplified.

Thereafter, a column select signal CSLi is activated according to a column address and amplified in the sense amplifier 22nm, so that the amplified signal is read out to the outside of the chip (t24). On the other hand, when the activate command ACT for the cell array block 21m is issued in parallel to the series of operations, any one of the word lines WLmi of the cell array block 21m is activated (t26) regardless of the operation of the cell array block 21n. This is enabled since the cell array block 21m is disconnected by the transfer gate 23R from the sense amplifier 22nm during the time when the cell array block 21n is to be accessed.

When data read out from the cell array block 21n is restored to a predetermined voltage by the sense amplifier 22nm, an operation flow goes to a precharge operation of the cell array block 21n. In a concrete manner, a word line WLni of a memory cell is made non-active (t25) and subsequently, the control signal EQLnm is activated (t26). With this activation, the bit lines BLn, bBLn in the cell array block 21n and the bit lines BLnm, bBLnm in the sense amplifier 22nm are precharged to a predetermined voltage. In the case of FIG. 8, the precharge operation of the cell array block 21n and the start of activation of a word line WLmi of the cell array block 21m is the same in timing. Read-out of cell data onto the bit lines BLm, bBLm in the cell array block 21m is awaited and thereafter, the control signals PHITL, PHITR are shifted and the transfer gates 23L, 23R are changed over (t27).

With this change-over, cell data in the two adjacent cell array blocks 21n and 21m do not conflict with each other in the sense amplifier 22nm and thereby an overlap operation between the adjacent cell array blocks can be effected. That is, when the common sense amplifier circuit system is adopted and successive access covering two adjacent cell array blocks is conducted, a higher speed than successive access within the same cell array block can be achieved. From the above description, even when a common sense amplifier system is adopted mainly from the view point of cost oriented consideration, a constraint in terms of the speed of an ordinary common sense amplifier system can be alleviated and therefore, compatibility between performance and cost is realized.

Figure 9:
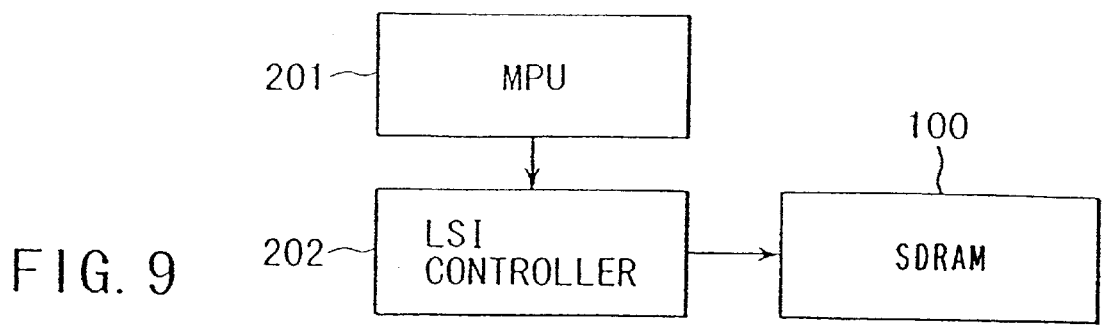
FIG. 9 shows a construction of a semiconductor memory system to which the present invention is applied.

The internal construction of the SDRAM 100 to which the present invention is applied is not different from a conventional SDRAM and an operation according to a way of access can be effected. Such operation mode control is in a concrete manner conducted in a memory system which comprises: a microprocessor 201 which issues a access requirement; and a memory controller LSI 202 which accesses the SDRAM 100 in response to the access requirement from the microprocessor 201, as shown in FIG. 9. The operation modes 1, 2 and 3 of the first and second embodiments are determined by a software in the microprocessor 201 and activate commands ACT with different cycle times are issued according to operation modes.

Figure 10:
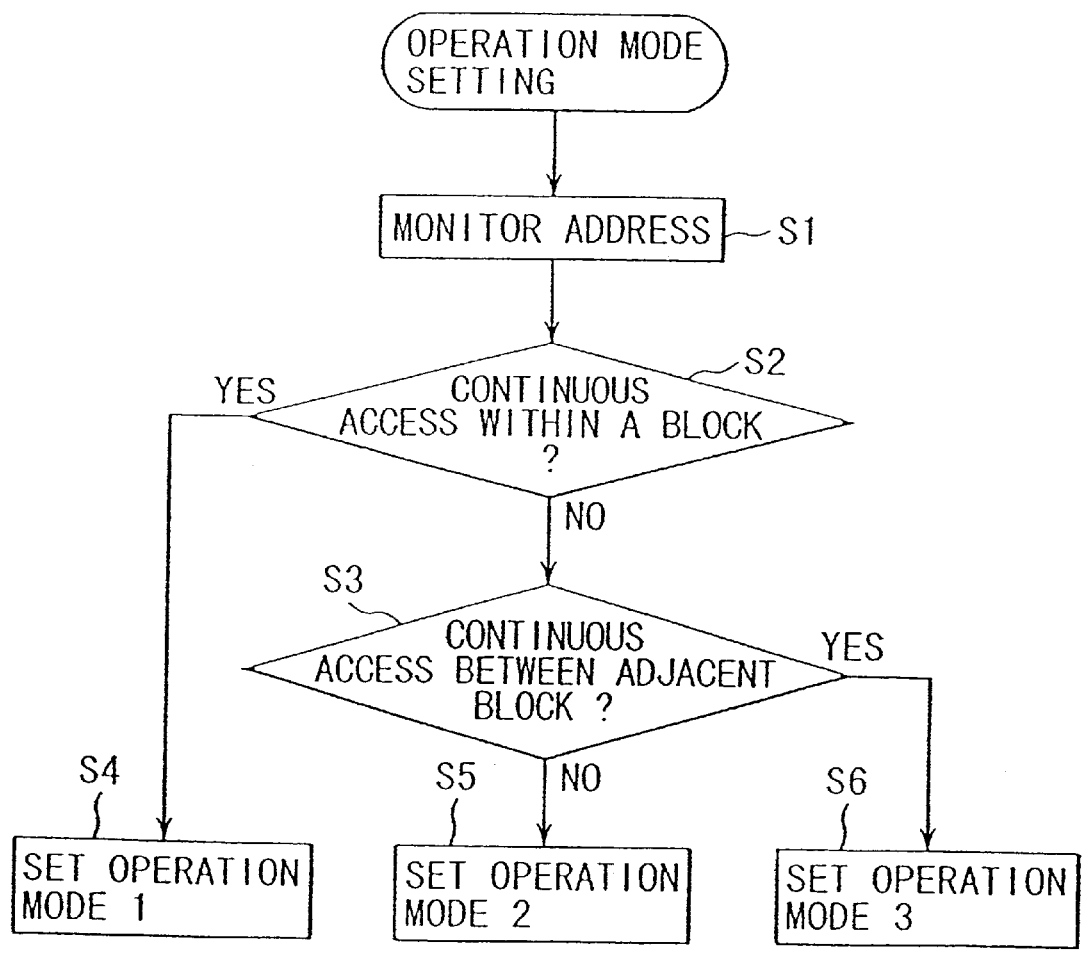
FIG. 10 shows an algorithm for setting a DRAM operation mode in the memory system.

FIG. 10 shows an algorithm for an operation mode setting by the microprocessor 201. Address data of the SDRAM which is an object to be accessed is at first monitored in setting of an operation mode (S1). Since assignment of addresses for a cell array block in the SDRAM is known in advance, it is judged whether or not addresses are ones on which successive access is to be conducted within the interior of one cell array block based on the address assignment (S2). When the judgment is YES, the first operation mode 1 with the longest cycle time is set (S4), but when the judgment is NO, it is further judged whether or not the addresses are ones on which successive access is conducted while covering adjacent cell array blocks (S3). When the judgment is NO, the operation mode 2 with the shortest cycle time is set, since addresses are ones on which successive access is conducted while covering dispersed cell array blocks (S5), but when the judgment is YES, the operation mode 3 with the medium cycle time is set (S6).

In this way, the microprocessor 201 can determine clock cycles, as described above, in which an activate command ACT is issued according to an operation mode for access in the SDRAM.

Embodiment 3

Figure 11:
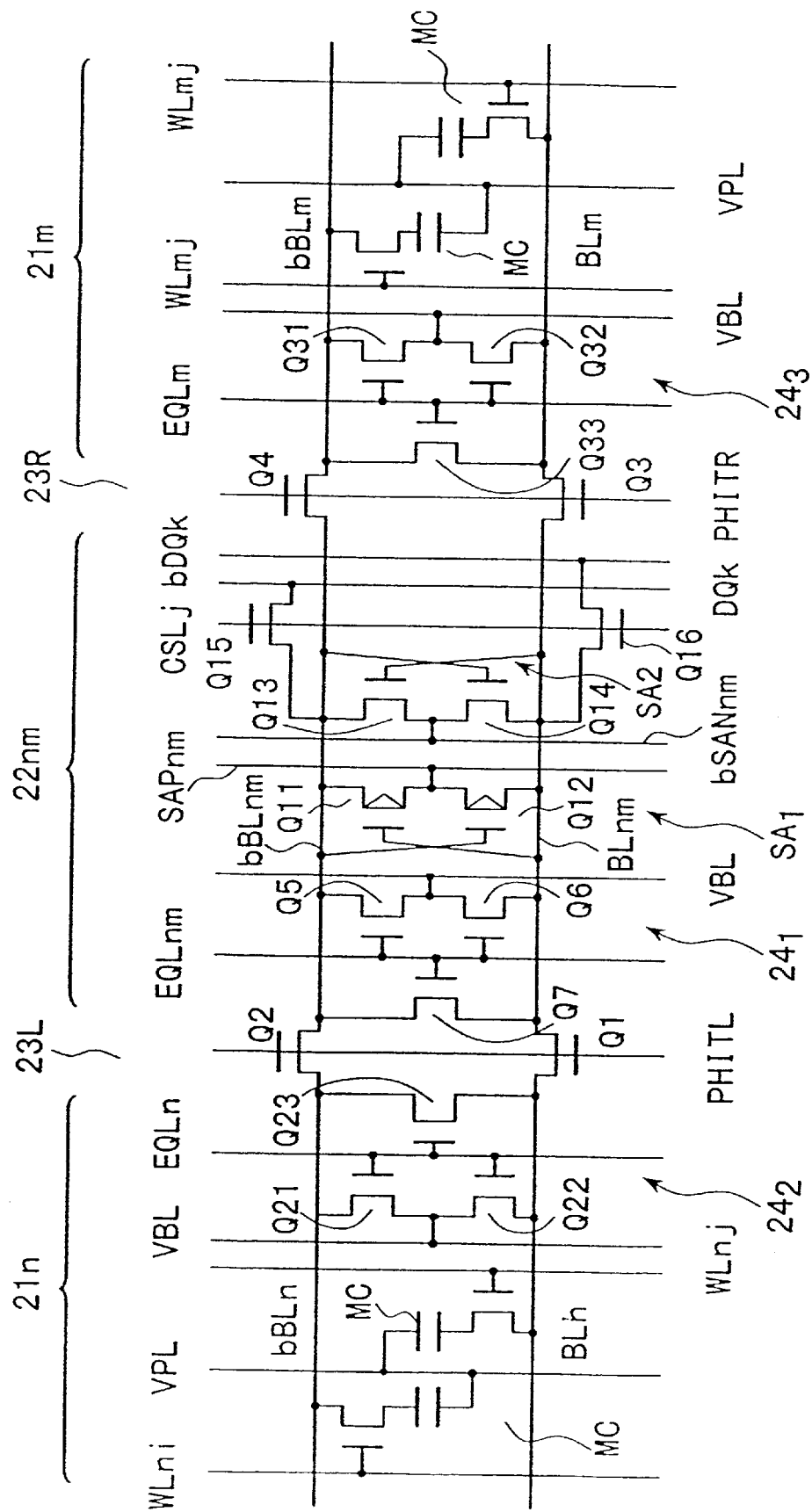
FIG. 11 shows a construction of main part of an SDRAM in a third embodiment of the present invention.

The third embodiment makes an interleave operation in access covering adjacent cell array blocks with the common sense amplifier system in use deep as compared with the foregoing embodiments. In order to conduct such a deep interleave operation, it is required to change the construction of the core circuit section of the SDRAM. A core circuit construction in the case of applying the third embodiment to FIG. 3 is shown in FIG. 11. What is different from FIG. 3 is in that a bit line equalizer circuit 241 is provided in the sense amplifier 22nm and at the same time, bit line equalizer circuits 242 and 243 with the similar construction are respectively provided in the cell array blocks 21n and 21m as well.

Figure 12:
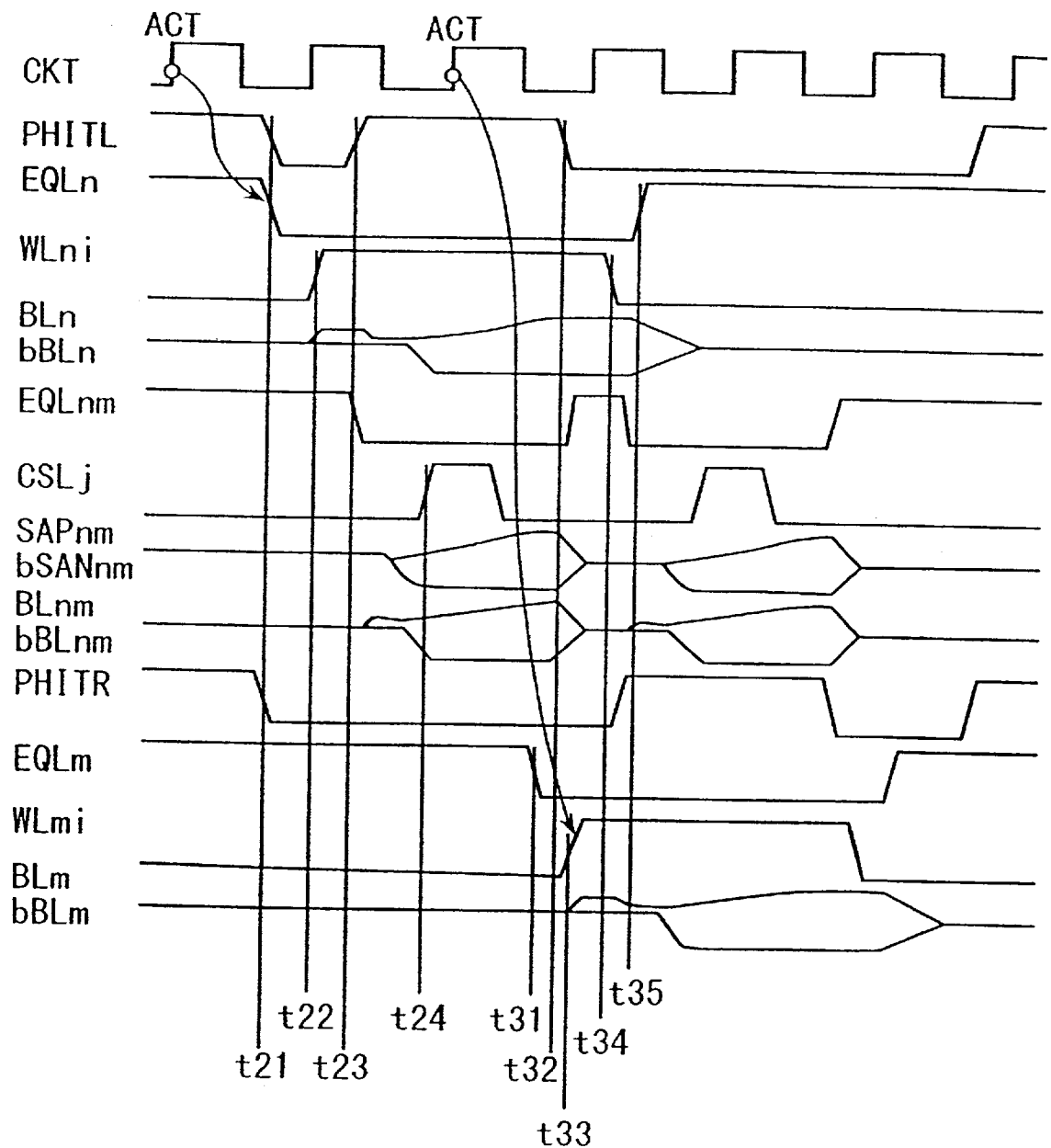
FIG. 12 show an access operation timing in the third embodiment of the present invention.

FIG. 12 is a diagram showing an operation timing of the third embodiment. In the third embodiment, an equalize operation of the bit lines BLnm, bBLnm arranged in the common sense amplifier 22nm and equalize operations in the cell array blocks 21n and 21m are independently performed from each other. This is because the bit line pair BLnm and bBLnm in the common sense amplifier 22nm is equalized as fast as possible and preparation is performed for read-out from a cell array block which is accessed in an overlapped manner with the equalize operation, and subsequently to which, access is to be conducted, in order to realize a high speed in the case where successive access covering the adjacent cell array blocks 21n and 21m arises.

With the preparation being finished, it is enabled that a bit line equalize operation (which is driven by a rise of the signal EQLn) for which completion of non-activation of a word line WLni is a precondition and an equalize operation (which is driven by a rise of the signal EQLnm) of the bit lines BLnm and bBLnm in the sense amplifier 22nm on which a very small signal from a memory cell in the next cycle is required to be sensed and amplified can independently be performed from each other without waiting for non-activation of the word line WLni.

Operations of FIG. 12 will be described in a concrete manner. Control signals PHITL, PHITR are shifted to make the transfer gates 23L and 23R non-conductive (t21) and a word line WLni is raised and memory cell data of the cell array block 21n is read out (t22). Then, the column select signal CSLj is raised to retrieve data read out from the cell array block 21n to the outside (t24). Operations thus far are basically similar to those of the second embodiment described previously.

When the equalize control signal EQLm is held at H and the bit line equalize operation is on-going in the cell array block 21m while data is read out in the cell array block 21n, and when the equalize operation is completed (t31), the control signal PHITL falls and at the same time, the equalize control signal EQLnm of the sense amplifier 23nm is raised (t32). That is, the transfer gate 23L is made non-conductive prior to a time t34 at which the word line WLni in the cell array block 21n falls and the bit line equalization of the sense amplifier 22nm is conducted. A selected word line WLmi in the cell array block 21m is raised while the bit line equalization in the sense amplifier 22nm is on-going (t33). The bit line equalize operation in the cell array block 21n side gets started for preparation for the next operation while data read-out in the cell array block 21m is performed (t35).

In this way, with the equalization which has been conducted in advance of the bit lines BLnm, bBLnm in the sense amplifier 22nm, a high speed access when successive access covering adjacent cell array blocks arises is enabled as compared with the second embodiment. In general, a capacitance of the bit line pair in the cell array block 21n and 21m in which a plurality (for example, 128, 256, 512 or the like) of memory cells are connected is several times to some tens of times as large as that of the bit line pair BLnm, bBLnm in the sense amplifier 22nm. For this reason, the time for bit line equalization in a cell array block has a tendency to be necessarily elongated. When a transfer gate is controlled to be non-conductive by shifting the signal PHITL immediately after a precharge operation gets started like the third embodiment and the bit line equalization is performed at a high speed, an equalize operation of the sense amplifier 22nm which is desired to be completed for preparation for use in the next cycle can be made hard to receive an influence of bit line equalization in the cell array block which is apt to be slower.

According to the third embodiment, as described above, the bit line equalizer circuits 242 and 243 are arranged in the cell array blocks 21n and 21m as well in a dispersed manner, a transfer gate interposed between the sense amplifier 23nm and the cell array blocks is controlled to be non-conductive immediately after the precharge gets started and equalization of the bit line pair in the sense amplifier 23nm is completed prior to equalization of the bit line pair in the cell array block, so that a high speed access and a high speed cycle can be realized when successive access covering adjacent cell array blocks arises.

In the embodiment, since the bit line equalizer circuits 242 and 243 constructed from NMOS transistors Q21 to Q23 and Q31 to Q33 are provided, the chip size is increased by an area for the transistors to occupy. However, the NMOS transistors Q21 to Q23 constituting the bit line equalizer circuit 242 can be formed in the same well as that for the NMOS transistors Q1 and Q2 and likewise, the NMOS transistors Q31 to Q33 constituting the bit line equalizer circuit 243 can be formed in the same well as that for the NMOS transistors Q3 and Q4. Accordingly, there is no great increase in chip area.

Embodiment 4

Figure 13:
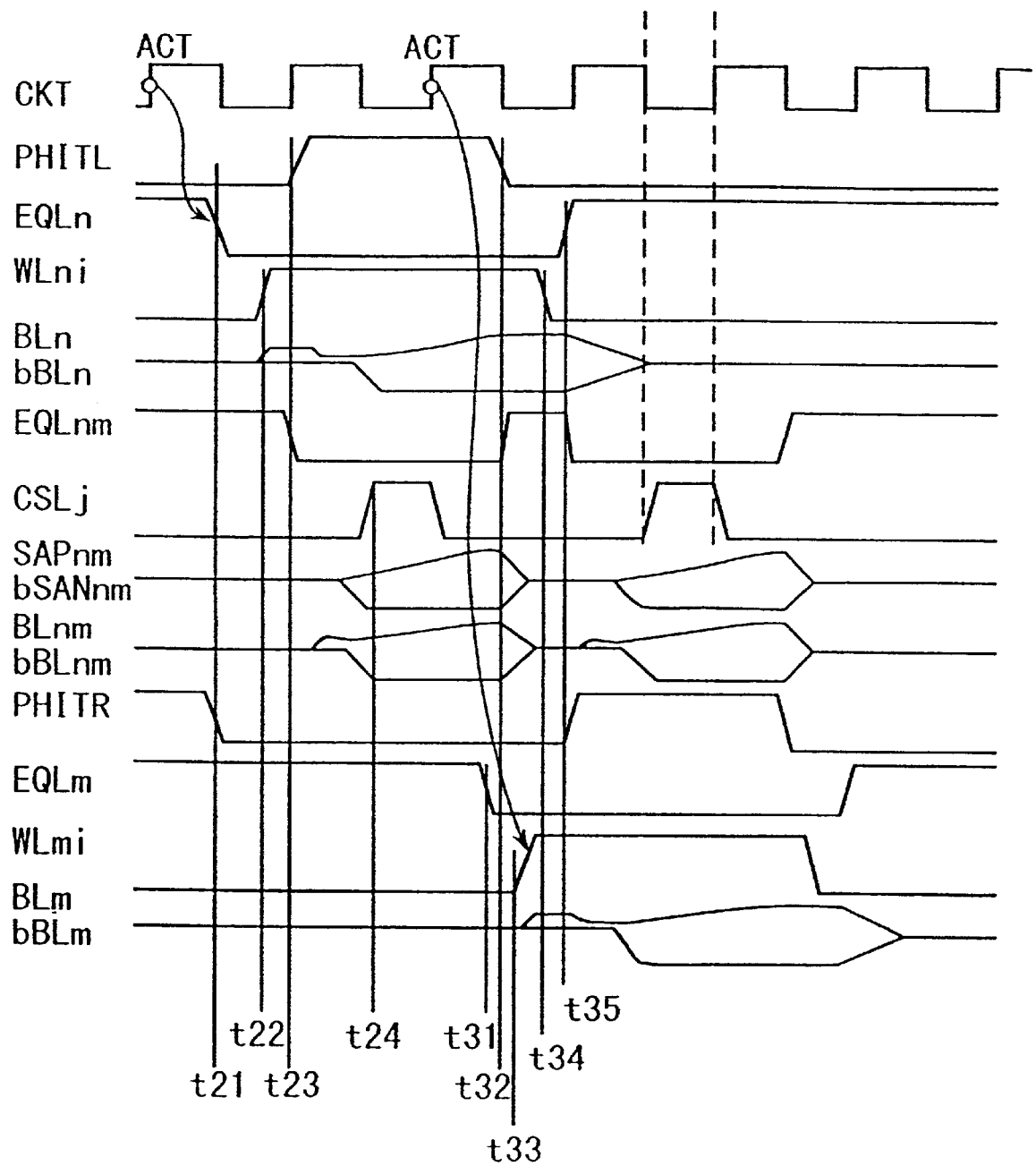
FIG. 13 is shows an access operation timing in modification of the operation of FIG. 12.
Figure 14:
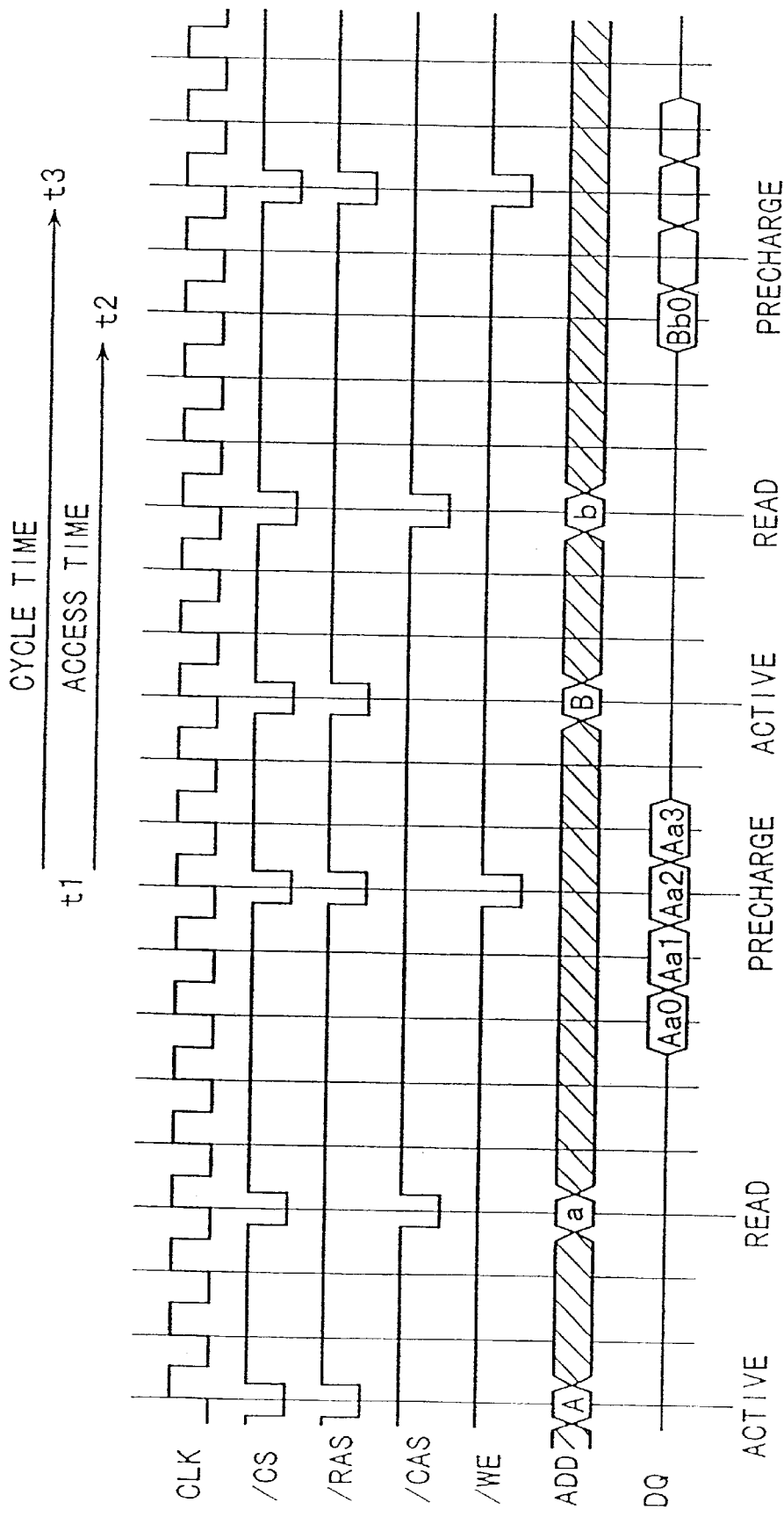
FIG. 14 shows an operation timing of a conventional SDRAM.
Figure 15:
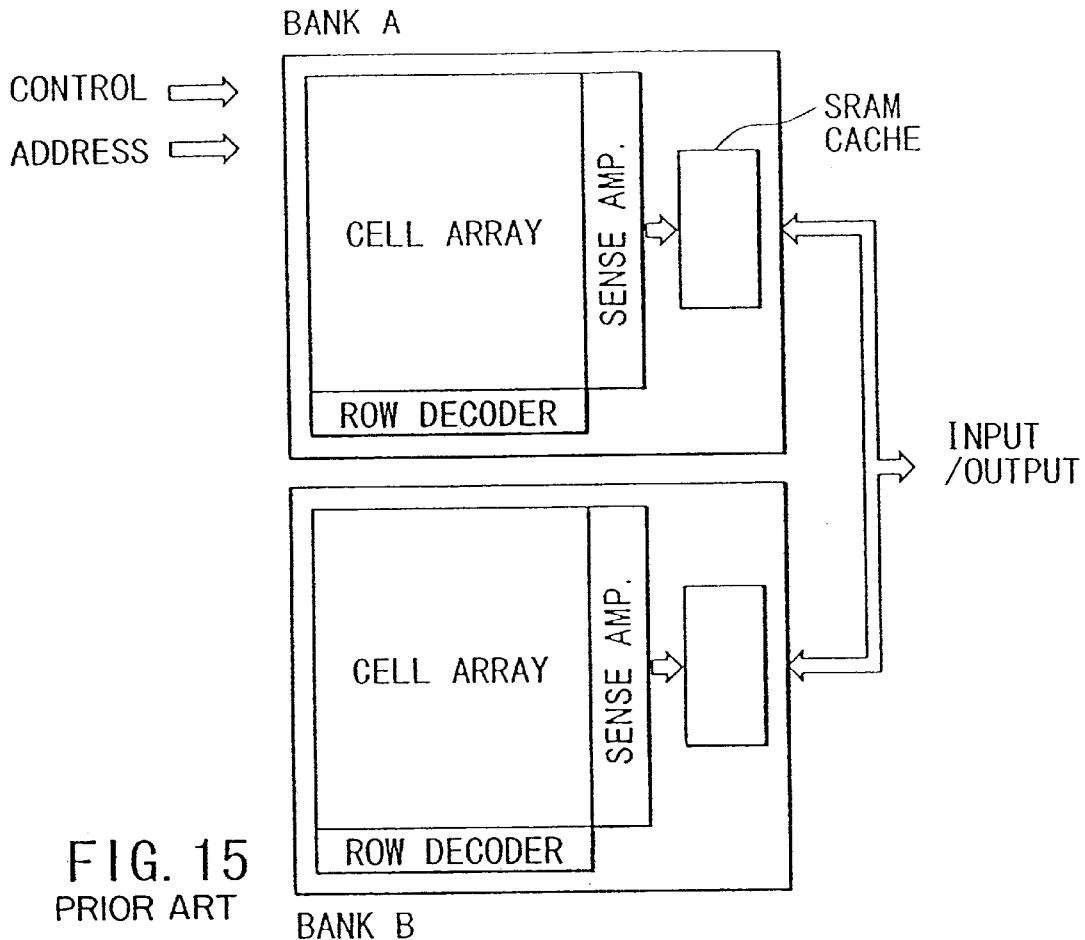
FIG. 15 shows a conventional method for obtaining a high speed access on a DRAM.
Figure 16:
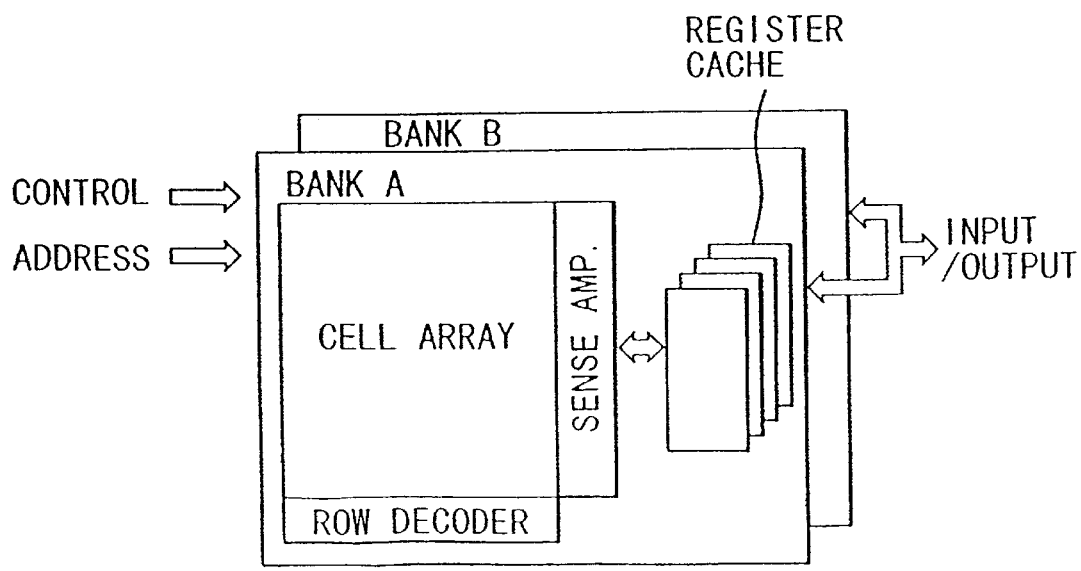
FIG. 16 is another conventional method for obtaining a high speed access on a DRAM.

A fourth embodiment is a modification of the third embodiment. In the fourth embodiment, too, the core circuit of FIG. 11 is used. An operation timing of the fourth embodiment is shown in FIG. 13. What is different from the operation timing of FIG. 12 is in a way of controlling the transfer gates 23L and 23R. That is, in the core circuit of FIG. 11, the equalizer circuits 242 and 243 are arranged in not only the sense amplifier 22nm, but the cell array blocks 21n and 21m. In the operations of FIG. 13, therefore, the transfer gate control signal PHITL is kept to be non-active while the equalize control signal EQLn in the sub-cell block 21n side is active. Likewise, the transfer gate control signal PHITR is kept to be non-active while the equalize control signal EQLm in the sub-cell block 21m side is active.

Even when cell array blocks and a sense amplifier are electrically disconnected by normally placing the transfer gates 23L and 23R in the non-conductive state, the bit line pair does not assume the electrically floating state and thereby no trouble occurs for an operation of a DRAM as far as the bit line equalizer circuit is active.

When this method is employed, the number in which the transfer gate control signals PHITL, PHITR are shifted can be smaller and therefore, consumed power in company with charge/discharge of the control signal lines can be reduced. Operations other than the transfer gate control method are not described in detail since the operations are same as the third embodiment.

According to the embodiment, reduction in consumed power can be realized by avoiding useless charge/discharge operations.

In this text and the claims, the cell array block should not be restricted to the configurations as shown in the FIGS. 2A and 2B. The configurations of the cell array blocks of FIGS. 2B and 2B are merely examples. As another example, the cell array blocks may have a configuration which comprises two or more sets of the sense amplifiers S/A 22 and the cell array blocks 21 arranged in the bit line direction. For example, in FIG. 2B, the two set of the sense amplifiers S/A 22 and the cell array blocks 21 may comprise S/A 22—cell array blocks <0>—S/A 22—cell array blocks <1>. A further example may comprise two or more sets of the sense amplifiers S/A 22 and the cell array blocks 21 arranged in the word line direction, though not shown in FIG. 2B. In a still further example, the cell array blocks may have a configuration which comprises two or more sets of the sense amplifiers S/A 22 and the cell array blocks 21 arranged in the bit line direction and two or more sets of the sense amplifiers S/A 22 and the cell array blocks 21 arranged in the word line direction. Moreover, each of the set may comprise a row decoder. Of course, each of the set may include other system components. In short, the configurations of the cell array blocks can be determined to provide a high performance of operation of the memory system.

While the embodiments of the present invention are described above, the present invention. is not limited to the above embodiments, but various modifications and changes thereof can be executed without departing from the scope of the present invention. Besides, while the description above is made especially with an SDRAM as being central to the present invention, it is to be understood, however, that the present invention can be also applied to a DRAM, an SRAM, an FRAM, a PRAM and the other semiconductor memories other than the SDRAM, which are ordinary ones, and in each of which a common sense amplifier system is adopted.

According to the present invention, as described above, a semiconductor memory system such as a DRAM with a high speed cycle in which a wait cycle of a MPU which occurs in a cache miss can be decreased to the lowest level possible without adding a register circuit or the like to a conventional DRAM in general use can be realized. Especially, a time constraint that a cycle time of access is different according to the order of cell array blocks in which memory cells to be accessed are arranged is introduced, and thereby, no incorporation of a register circuit or the like is necessary. Therefore, overhead for a chip size can be suppressed and thereby a DRAM with a high added value in which performance and cost are compatible can be provided.

In addition, in the case where a semiconductor memory has a construction in which a common sense amplifier circuit system is introduced and successive access covering two adjacent cell array blocks is conducted in the semiconductor memory, an interleave operation in which a precharge operation of a cell array block which is accessed in advance and a word line activation of a cell array block which is subsequently accessed are performed in parallel to each other is applied and thereby a high speed access time constraint can be realized. With such a high speed, even when a common sense amplifier system is adopted mainly from the view point of the cost, a restriction in terms of a speed can be alleviated, so that compatibility between performance and cost comes to be a reality.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a cell block including a plurality of memory cells coupled to a plurality of word lines;
   a bit line pair including first and second bit lines coupled to said cell block;
   a sense amplifier coupled to said first and second bit lines;
   first and second select gates provided between said cell block and said sense amplifier, and coupled to said first and second bit lines, respectively;
   a first equalizer circuit coupled to first parts of said first and second bit lines which are at a side of said cell block with respect to said first and second select gates, said first equalizer circuit configured to equalize potentials on said first parts of said first and second bit lines; and
   a second equalizer circuit coupled to second parts of said first and second bit lines which are at a side of said sense amplifier with respect to said first and second select gates, said second equalizer circuit configured to equalize potentials on said second parts of said first and second bit lines,
   wherein said first and second equalizer circuits equalize the potentials on said first and second parts of said first and second bit lines independently from each other.

2. The semiconductor memory device according to claim 1, wherein any of said word lines are activated, while said second equalizer circuit equalizes the potentials on said second parts of said first and second bit lines.

3. The semiconductor memory device according to claim 3, wherein said first and second select gates are disabled, while said first equalizer circuit equalizes the potentials on said first parts of said first and second bit lines.

4. The semiconductor memory device according to claim 1, wherein said first and second select gates are disabled, while said first equalizer circuit equalizes the potentials on said first parts of said first and second bit lines.

5. The semiconductor memory device according to claim 1, wherein said second equalizer circuit equalizes the potentials on said second parts of said first and second bit lines, before said word lines connected to said cell block are disabled.

6. The semiconductor memory device according to claim 1, wherein said first and second select gates are disabled upon precharging, to equalize said second parts of said first and second bit lines prior to equalizing said first parts of said first and second bit lines.

7. A semiconductor memory device comprising:

a first cell block including a plurality of memory cells coupled to a plurality of word lines;

a second cell block including a plurality of memory cells coupled to a plurality of word lines;

a bit line pair including first and second bit lines coupled to said first and second cell blocks;

a sense amplifier provided between said first cell block and said second cell block, and coupled to said first and second bit lines;

first and second select gates provided between said first cell block and said sense amplifier, and coupled to said first and second bit lines, respectively;

third and fourth select gates provided between said second cell block and said sense amplifier, and coupled to said first and second bit lines, respectively;

a first equalizer circuit coupled to first parts of said first and second bit lines which are at a side of said first cell block with respect to said first and second select gates, said first equalizer circuit configured to equalize potentials on said first parts of said first and second bit lines;

a second equalizer circuit coupled to second parts of said first and second bit lines which are between said first and second select gates on one hand and said third and fourth select gates on the other hand, said second equalizer circuit configured to equalize potentials on said second parts of said first and second bit lines; and a third equalizer circuit coupled to third parts of said first and second bit lines which are at a side of said second cell block with respect to said third and fourth select gates, said third equalizer circuit configured to equalize potentials on said third parts of said first and second bit lines, wherein said first, second and third equalizer circuits equalize the potentials on said first, second and third parts of said first and second bit lines independently from each other.

8. The semiconductor memory device according to claim 7, wherein any of said word lines are activated, while said second equalizer circuit equalizes the potentials on said second parts of said first and second bit lines.

9. The semiconductor memory device according to claim 8, wherein said third equalizer circuit equalizes the potentials on said third parts of said first and second bit lines, while data are read out from the memory cells of said first cell block to said first and second bit lines.

10. The semiconductor memory device according to claim 9, wherein said third and fourth select gates are disabled, while said third equalizer circuit equalizes the potentials on said third parts of said first and second bit lines.

11. The semiconductor memory device according to claim 7, wherein said third and fourth select gates are disabled, while said third equalizer circuit equalizes the potentials on said third parts of said first and second bit lines.

12. The semiconductor memory device according to claim 7, wherein said second equalizer circuit equalizes the potentials on said second parts of said first and second bit lines after said first and second select gates are disabled, while said sense amplifier senses and amplifies data read out from said first cell block.

13. The semiconductor memory device according to claim 12, wherein any of said word lines of said second cell block are activated, while said second equalizer circuit equalizes the potentials on said second parts of said first and second bit lines.

14. The semiconductor memory device according to claim 13, wherein said third equalizer circuit equalizes the potentials on said third parts of said first and second bit lines, while data are read out from the memory cells of said first cell block to said first and second bit lines.

15. The semiconductor memory device according to claim 14, wherein said third and fourth select gates are disabled, while said third equalizer circuit equalizes the potentials on said third parts of said first and second bit lines.

16. The semiconductor memory device according to claim 12, wherein said third and fourth select gates are disabled, while said third equalizer circuit equalizes the potentials on said third parts of said first and second bit lines.

17. The semiconductor memory device according to claim 7, wherein said third and fourth select gates are disabled, while said third equalizer circuit equalizes the potentials on said third parts of said first and second bit lines.

18. The semiconductor memory device according to claim 7, wherein said second equalizer circuit equalizes the potentials on said second parts of said first and second bit lines, before said word lines connected to said first cell block are disabled.

19. The semiconductor memory device according to claim 7, wherein said first and second select gates are disabled upon precharging, to equalize said second parts of said first and second bit lines prior to equalizing said first parts of said first and second bit lines.

* * * * *